US007834712B2

(12) United States Patent
Shumarayev et al.

(10) Patent No.: US 7,834,712 B2
(45) Date of Patent: Nov. 16, 2010

(54) TECHNIQUES FOR PROVIDING OPTION CONDUCTORS TO CONNECT COMPONENTS IN AN OSCILLATOR CIRCUIT

(75) Inventors: Sergey Shumarayev, Los Altos Hills, CA (US); Wilson Wong, San Francisco, CA (US); Allen Chan, San Jose, CA (US); Ali Atesoglu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 63 days.

(21) Appl. No.: 12/277,810

(22) Filed: Nov. 25, 2008

(65) Prior Publication Data

US 2010/0090774 A1      Apr. 15, 2010

Related U.S. Application Data

(60) Provisional application No. 61/104,230, filed on Oct. 9, 2008.

(51) Int. Cl.
*H03B 5/00* (2006.01)
(52) U.S. Cl. .................. 331/177 V; 331/117 R
(58) Field of Classification Search .......... 331/177 V, 331/117 R
See application file for complete search history.

(56) References Cited

U.S. PATENT DOCUMENTS

| | | | | |
|---|---|---|---|---|
| 3,659,205 | A | * | 4/1972 | Cooke et al. .............. 455/198.1 |
| 4,868,525 | A | * | 9/1989 | Dias ........................... 331/111 |
| 5,303,402 | A | | 4/1994 | McLaughlin et al. |
| 5,644,605 | A | * | 7/1997 | Whiteside .................. 375/375 |
| 6,018,251 | A | | 1/2000 | Kolze |
| 6,445,257 | B1 | * | 9/2002 | Cox et al. ................ 331/117 R |
| 6,596,563 | B2 | * | 7/2003 | Yuan et al. .................. 438/118 |
| 7,183,866 | B2 | * | 2/2007 | Yang et al. ..................... 331/74 |
| 7,209,017 | B2 | | 4/2007 | Sze et al. |
| 7,323,948 | B2 | * | 1/2008 | Ding et al. .................. 331/181 |
| 2001/0050878 | A1 | * | 12/2001 | Yanagisawa ........... 365/230.06 |
| 2003/0048145 | A1 | | 3/2003 | Albon et al. |
| 2004/0233002 | A1 | | 11/2004 | Hsiao |
| 2004/0263308 | A1 | | 12/2004 | Yu et al. |
| 2008/0024349 | A1 | | 1/2008 | Bhagat et al. |

FOREIGN PATENT DOCUMENTS

WO        2006020873        2/2006

OTHER PUBLICATIONS

Axel Berny et al., "A Wideband LC VCO in CMOS," BWRC Winter 2003 Retreat, Jan. 23, 2003, pp. 1-20.
John Wood, et al., "Rotary Traveling-Wave Oscillator Arrays: A New Clock Technology," IEEE Journal of Solid-State Circuits, vol. 36, No. 11, Nov. 2001, pp. 1654-1665.
Korean Intellectual Property Office, International Search Report and Written Opinion of the International Searching Authority for patent application PCT/US2009/059569, mailed May 13, 2010.

* cited by examiner

*Primary Examiner*—Joseph Chang
(74) *Attorney, Agent, or Firm*—Steven J. Cahill

(57) ABSTRACT

An oscillator circuit includes transistors that are cross-coupled through routing conductors in a first conductive layer. The oscillator circuit also includes a varactor, a capacitor, and an option conductor in a second conductive layer. The option conductor forms at least a portion of a connection between one of the transistors and the capacitor or the varactor.

23 Claims, 5 Drawing Sheets

US 7,834,712 B2

1

TECHNIQUES FOR PROVIDING OPTION CONDUCTORS TO CONNECT COMPONENTS IN AN OSCILLATOR CIRCUIT

CROSS REFERENCE TO RELATED APPLICATION

This patent application claims the benefit of U.S. provisional patent application 61/104,230, filed Oct. 9, 2008, which is incorporated by reference herein.

BACKGROUND OF THE INVENTION

The present invention relates to electronic circuits, and more particularly, to techniques for providing optional connections to components in an oscillator circuit.

Phase-locked loop circuits typically generate an output clock signal in response to an input clock signal using an oscillator circuit.

BRIEF SUMMARY OF THE INVENTION

According to some embodiments of the present invention, an oscillator circuit includes transistors that are cross-coupled through routing conductors in a first conductive layer. The oscillator circuit may also include a varactor, a capacitor, and an option conductor in a second conductive layer. The option conductor forms at least a portion of a connection between one of the transistors and the capacitor or the varactor. The present invention includes circuits and methods for implementing the embodiments described herein.

Various objects, features, and advantages of the present invention will become apparent upon consideration of the following detailed description and the accompanying drawings.

DETAILED DESCRIPTION OF THE INVENTION

Figure 1:
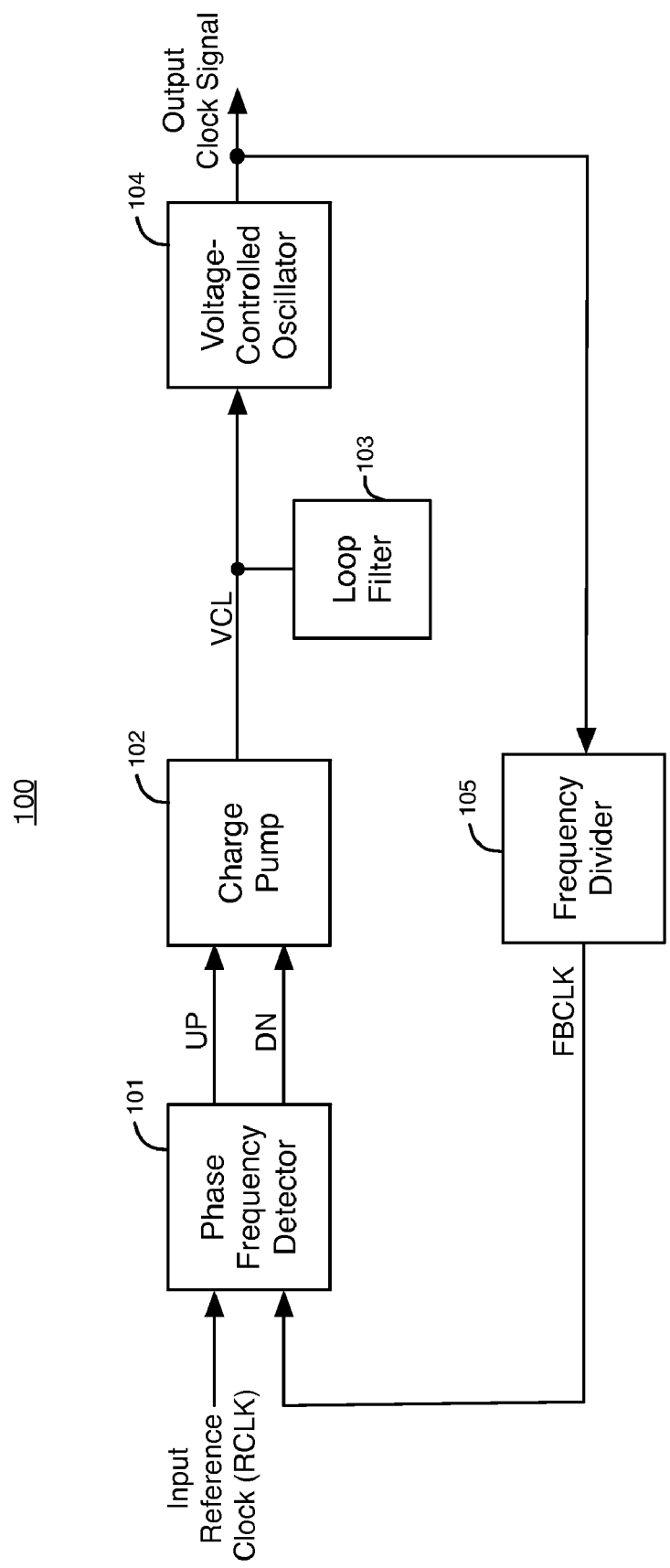
FIG. 1 illustrates an example of a phase-locked loop (PLL) circuit that can include embodiments of the present invention.

FIG. 1 illustrates an example of a phase-locked loop (PLL) circuit 100 that can include embodiments of the present invention. PLL 100 includes phase frequency detector (PFD) circuit 101, charge pump (CP) circuit 102, loop filter (LF) circuit 103, voltage-controlled oscillator (VCO) circuit 104, and frequency divider circuit 105. PLL 100 is one example of a PLL that can include embodiments of the present invention. It should be understood that embodiments of the present invention can be used with PLLs having numerous other configurations.

PLL 100 is typically fabricated on an integrated circuit. PLL 100 can, for example, be fabricated on an application specific integrated circuit (ASIC) or on a programmable logic integrated circuit, such as a field programmable gate array (FPGA).

An input reference clock signal RCLK is transmitted to a first input terminal of phase frequency detector (PFD) circuit 101. PFD 101 compares the phase and the frequency of reference clock signal RCLK to the phase and the frequency of a feedback clock signal FBCLK to generate pulses in UP and DN output phase error signals.

The UP and DN signals are transmitted to input terminals of charge pump (CP) circuit 102. Charge pump (CP) 102 controls its output control voltage VCL in response to the UP and DN signals. The output control voltage VCL of charge pump 102 is low pass filtered by loop filter (LF) circuit 103. CP 102 sends charge to loop filter 103 in response to logic high pulses in the UP signal. CP 102 drains charge from loop filter 103 in response to logic high pulses in the DN signal.

The control voltage VCL filtered by LF block 103 is transmitted to an input terminal of voltage-controlled oscillator (VCO) circuit 104. VCO 104 generates a periodic output clock signal in response to control voltage VCL. The output clock signal of VCO 104 is transmitted to frequency divider circuit 105. Frequency divider circuit 105 divides the frequency of the output clock signal of VCO 104 by a frequency division value to generate the frequency divided feedback clock signal FBCLK.

PFD 101 generates logic high pulses in the UP signal that are longer than the logic high pulses in the DN signal when the frequency of reference clock signal RCLK is greater than the frequency of feedback clock signal FBCLK. When logic high pulses in the UP signal are longer than logic high pulses in the DN signal, CP 102 increases control voltage VCL, causing the frequency of the periodic output clock signal of VCO 104 to increase, which causes the frequency of the FBCLK signal to increase.

PFD 101 generates logic high pulses in the DN signal that are longer than the logic high pulses in the UP signal when the frequency of feedback clock signal FBCLK is greater than the frequency of reference clock signal RCLK. When logic high pulses in the DN signal are longer than logic high pulses in the UP signal, CP 102 decreases control voltage VCL, causing the frequency of the periodic output clock signal of VCO 104 to decrease, which causes the frequency of the FBCLK signal to decrease.

VCO 104 varies the frequency of its output clock signal in response to changes in the control voltage VCL, until reference clock signal RCLK and feedback clock signal FBCLK are frequency and phase aligned. PLL 100 is in lock mode when reference clock signal RCLK and feedback clock signal FBCLK have the same frequency and phase.

Figure 2:
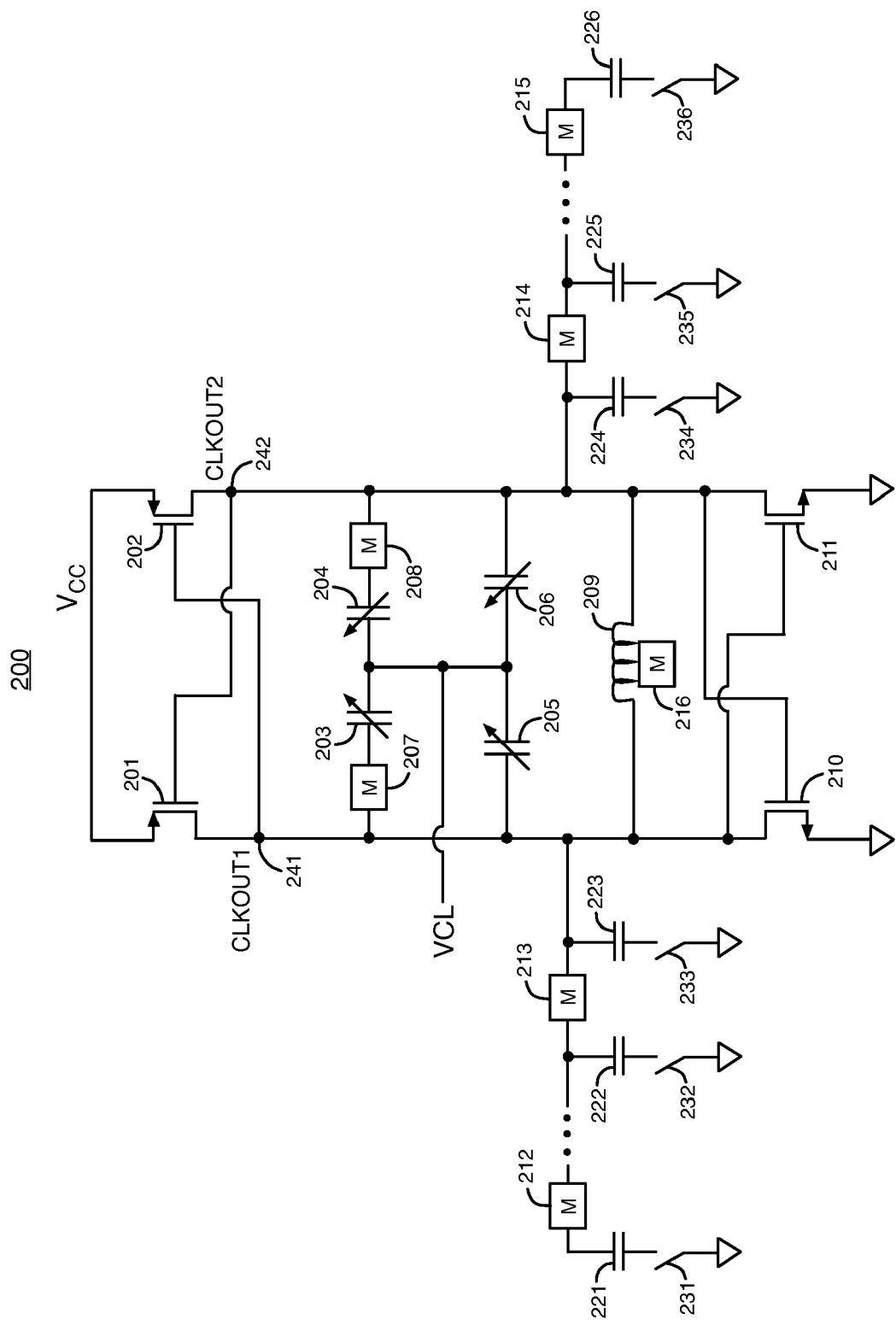
FIG. 2 is a schematic diagram of an inductor capacitor (LC) voltage-controlled oscillator (VCO), according to an embodiment of the present invention.

FIG. 2 is a schematic diagram of an inductor capacitor (LC) voltage-controlled oscillator (VCO) 200, according to an embodiment of the present invention. LC VCO 200 (also referred to herein as VCO 200) is an example of an architecture that can be used to implement VCO 104 in FIG. 1. VCO 200 includes p-channel field-effect transistors (FETs) 201-202, n-channel FETs 210-211, inductor 209, varactors 203-206, capacitors 221-226, switches 231-236, and metal options 207-208 and 212-216. The transistors in VCO 200 can be, for example, metal oxide semiconductor FETs (i.e., MOSFETs). Transistors can implement switches 231-236.

Varactors 203, 204, 205, and 206 are capacitors that have a variable capacitance. The capacitance of each varactor 203-206 is dependent on the voltage across the varactor. Varactors 203-206 can be, for example, reverse-biased diodes or MOS varactors. MOS varactors are n-channel MOSFETs in which the bulk region is not p-type. The bulk region in a MOS varactor is in an N-type well, instead of a p-type substrate.

Charge pump 102 generates a control voltage VCL that is transmitted to a terminal of each of the varactors 203-206, as shown in FIG. 2. The capacitance of each varactor 203-206 varies in response to changes in the voltage across the varactor. The voltage across varactors 203-206 varies in response to changes in control voltage VCL and the voltages at nodes 241-242.

P-channel transistors 201-202 are cross-coupled. The gate of p-channel transistor 201 is coupled to the drain of p-channel transistor 202. The gate of p-channel transistor 202 is coupled to the drain of p-channel transistor 201. The sources of transistors 201-202 are coupled to receive a supply voltage VCC. The drain of transistor 201 is coupled to metal option 207, varactor 205, inductor 209, the drain of transistor 210, capacitor 223, and metal option 213. The drain of transistor 202 is coupled to metal option 208, varactor 206, inductor 209, the drain of transistor 211, capacitor 224, and metal option 214.

N-channel transistors 210-211 are cross-coupled. The gate of n-channel transistor 210 is coupled to the drain of n-channel transistor 211. The gate of n-channel transistor 211 is coupled to the drain of n-channel transistor 210. The sources of transistors 210-211 are coupled to receive a common ground voltage.

VCO 200 generates a first digital output clock signal CLKOUT1 having a 0° phase at output node 241. VCO 200 generates a second digital output clock signal CLKOUT2 at output node 242. The second output clock signal CLKOUT2 has a phase that is offset by 180° relative to the phase of the first output clock signal CLKOUT1. Transistors 201-202 and 210-211 turn on and off to generate transitions between logic high and logic low states in output clock signals CLKOUT1 and CLKOUT2. When transistors 201 and 211 are on, transistors 202 and 210 are off. When transistors 202 and 210 are on, transistors 201 and 211 are off. Either CLKOUT1 or CLKOUT2 can be transmitted to frequency divider 105 to generate the feedback clock signal FBCLK.

Inductor 209 and varactors 203-206 in VCO 200 form a parallel resonance LC tank. The capacitances of varactors 203-206 vary in response to changes in the control voltage VCL that are caused by charge pump 102. The LC tank locates its oscillating frequency as the control voltage VCL tunes the capacitances of varactors 203-206. The frequency tuning range $F_{OSC}$ of the output clock signals CLKOUT1 and CLKOUT2 of VCO 200 is shown in equation (1).

$$F_{OSC} = \frac{1}{2\pi\sqrt{L_{TANK} \times C_{TANK}}} \quad (1)$$

In equation (1), $L_{TANK}$ equals the inductance of inductor 209, and $C_{TANK}$ equals the combined capacitance of the capacitors 221-226 and the varactors 203-206 that are connected in VCO 200 such that current can flow through them.

VCO 200 can have any suitable number of capacitors coupled in parallel at node 241, and VCO 200 can have any suitable number of capacitors coupled in parallel at node 242. Three capacitors 221-223 are shown on the left side of FIG. 2 merely as an example. Also, three capacitors 224-226 are shown on the right side of FIG. 2 merely as an example.

Each of the capacitors 221-226 is coupled in series with a corresponding one of switches 231-236, as shown in FIG. 2. Switches 231-236 are coupled to receive a common ground voltage. Each of the capacitors 221-226 has a fixed capacitance. Changing the conductive state of one or more of switches 231-233 can vary the total capacitance at node 241. For example, the conductive state of switch 233 can be changed from open to closed to couple capacitor 223 to the ground terminal. Coupling capacitor 223 to the ground terminal adds the capacitance of capacitor 223 to node 241. As another example, the conductive state of switch 233 can be changed from closed to open to decouple capacitor 223 from the ground terminal. Decoupling capacitor 223 from the ground terminal removes the capacitance of capacitor 223 from node 241.

Changing the conductive state of one or more of switches 234-236 can vary the total capacitance at node 242. For example, the conductive state of switch 234 can be changed from open to closed to couple capacitor 224 to the ground terminal. Coupling capacitor 224 to the ground terminal adds the capacitance of capacitor 224 to node 242. As another example, the conductive state of switch 234 can be changed from closed to open to decouple capacitor 224 from the ground terminal. Decoupling capacitor 224 from the ground terminal removes the capacitance of capacitor 224 from node 242.

More of switches 231-236 can be closed to increase the capacitance at nodes 241-242, and more of switches 231-236 can be opened to decrease the capacitance at nodes 241-242. When more of switches 231-236 are open, the maximum frequency, the minimum frequency, the center frequency, and the other frequencies that VCO 200 can generate for clock signals CLKOUT1 and CLKOUT2 increase. When more of switches 231-236 are closed, the maximum frequency, the minimum frequency, the center frequency, and the other frequencies that VCO 200 can generate for clock signals CLKOUT1 and CLKOUT2 decrease. The capacitance at node 241 preferably equals the capacitance at node 242 so that VCO 200 is symmetrical along a vertical axis through its center.

The capacitors 221-223 that are coupled between node 241 and the ground terminal and the capacitors 224-226 that are coupled between node 242 and the ground terminal determine the frequency tuning range of VCO 200. At any particular set of conductive states of switches 231-236 and metal options 207-208 and 212-216, the frequency tuning range of VCO 200 equals the difference between the maximum and minimum frequencies of clock signals CLKOUT1 and CLKOUT2 generated by VCO 200. The maximum frequency of clock signals CLKOUT1 and CLKOUT2 within a particular frequency tuning range occurs when varactors 203-206 are at their minimum capacitance values. The minimum frequency of clock signals CLKOUT1 and CLKOUT2 within a particular frequency tuning range occurs when varactors 203-206 are at their maximum capacitance values. The capacitance of each varactor 203-206 is inversely proportional to the voltage applied across the varactor.

The fixed capacitances at nodes 241-242 can be changed to vary the minimum frequency, the maximum frequency, the center frequency, and the frequency tuning range that VCO 200 generates for output clock signals CLKOUT1 and CLKOUT2. Increasing the capacitances at nodes 241 and 242 after closing one or more of switches 231-233 and one or more of switches 234-236 reduces the minimum frequency, the maximum frequency, the center frequency, and the frequency tuning range of VCO 200. The frequency tuning range of VCO 200 is reduced when metal options 212-215 are conductive, because the capacitors 221-226 that are switched in at nodes 241-242 do not have adjustable capacitances. Capacitors 221-226 act as fixed loads. If metal options 212-215 are all conductive, the frequency tuning range that VCO 200 generates for CLKOUT1 and CLKOUT2 is reduced by a larger amount as more fixed capacitors 221-226 etc. are switched in at nodes 241-242.

In VCO 200, the top plates of capacitors 221-226 and switches 231-236 have parasitic capacitances that can increase the total capacitance at each of nodes 241 and 242. These parasitic capacitances limit the maximum frequency that VCO 200 can generate for CLKOUT1 and CLKOUT2 at any particular set of conductive states of switches 231-236 and metal options 207-208 and 212-216. For example, the parasitic capacitances of capacitors 221-226 can limit the maximum frequency of CLKOUT1 and CLKOUT2 if all of switches 231-236 are open and all of the metal options are conductive.

The capacitances of varactors 203-206 vary in response to control voltage VCL to generate fine tuning of the frequency of output clock signals CLKOUT1 and CLKOUT2. Capacitors 221-226 are switched in and out at nodes 241-242 using switches 231-236 to generate coarse tuning of the frequency of output clock signals CLKOUT1 and CLKOUT2 (i.e., to generate larger frequency changes than caused by the varactors).

VCO 200 includes metal options 207-208 and 212-216. Metal options 207-208 and 212-216 include conductors formed in one or more additional conductive layers that are different than the conductive layers used to form most of the conductors in VCO 200. The conductors that form the metal options may optionally be added to the integrated circuit die in one or more additional conductive layers. The metal options can be formed in one or more additional conductive layers using a metal or another suitable conductive material. Any of the conductors that form metal options 207-208 and 212-216 can be added to or removed from the mask for an additional conductive layer to make or break the corresponding metal option connection.

The mask for an additional conductive layer containing the metal options can be modified without having to modify each mask for the one or more conductive layers that contain the other conductors in VCO 200. This feature reduces the amount and the complexity of modifications that need to be made to the mask layers used to form the conductive layers in VCO 200. As a result, metal options 207-208 and 212-216 reduce the cost of modifying the mask layers that are used to create an integrated circuit die during the photolithography process. The metal options also reduce the time to market of an integrated circuit product, because extra time is not used to re-generate the other masks. Multiple integrated circuit dies can be created that have nearly the same oscillator circuit architecture using the masks. The oscillator circuit architecture differs between the integrated circuit dies only with respect to the conductivity of metal options 207-208 and 212-216 in the one or more additional conductive layers.

Figure 3A:
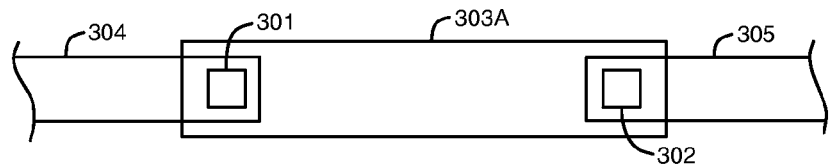
FIGS. 3A-3B are process layout diagrams that illustrate top down views of an example of a metal option, according to an embodiment of the present invention.
Figure 3B:
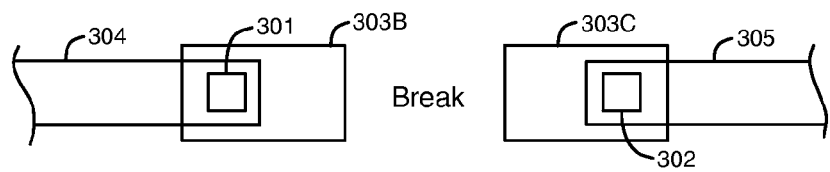

FIGS. 3A-3B are process layout diagrams that illustrate top down views of an example of a metal option, according to an embodiment of the present invention. The metal option shown in FIGS. 3A-3B is an embodiment that can be used to implement each of the metal options 207-208 and 212-215 shown in FIG. 2. It should be understood that the metal option shown in FIGS. 3A-3B is merely an example that is not intended to limit the scope of the present invention. Other types of configurations can also be used to implement the metal options shown in FIG. 2.

According to one particular example, most of the routing conductors that connect circuit elements 201-211, 221-226, and 231-236 are formed in a first metal layer on the integrated circuit die that contains VCO 200. These routing conductors are shown as solid lines that connect the circuit elements in FIG. 2. According to this example, the metal options 207-208 and 212-216 are formed in a second metal layer on the integrated circuit die. The first and the second metal layers are different metal layers. An integrated circuit die can have more than two metal layers (e.g., 11 metal layers). The first and the second metal layers described herein can be any two of the metal layers on the die.

FIG. 3A illustrates a routing conductor 303A that is formed in the second metal layer. Routing conductor 303A is an example of one of the metal options 207-208 and 212-215. Routing conductors 304-305 are formed in the first metal layer. The first metal layer contains most of the routing conductors in VCO 200. The metal option can connect routing conductors 304 and 305 by adding routing conductor 303A to the second metal layer. Routing conductor 303A is coupled to routing conductor 304 through via 301 and to routing conductor 305 through via 302.

The metal option can disconnect routing conductors 304 and 305 by removing a portion of routing conductor 303A from the second metal layer, as shown in FIG. 3B. FIG. 3B shows conductor 303B and conductor 303C, which are portions of conductor 303A in the second metal layer. Conductors 303B and 303C do not connect conductors 304 and 305 together, because there is a break between conductors 303B and 303C. The metal option (e.g., 207-208 and 212-215) becomes an open circuit when conductors 303B and 303C in the second metal layer do not connect conductors 304 and 305 together, as shown in FIG. 3B.

The photolithographic mask used to form the second metal layer can be modified to change the shape of routing conductor 303 between the configurations of FIGS. 3A-3B. The mask for the second metal layer can be modified without changing the mask for the first metal layer or the masks for any of the other layers used to form VCO 200 on the integrated circuit die during photolithography.

Metal option 216 can add one or more turns to the coil of inductor 209 or remove one or more turns from the coil of inductor 209. Metal option 216 can also increase the diameter of one or more turns of the coil of inductor 209 or decrease the diameter of one or more turns of the coil of inductor 209, in addition to or instead of changing the number of turns in the coil of inductor 209.

Figure 3C:
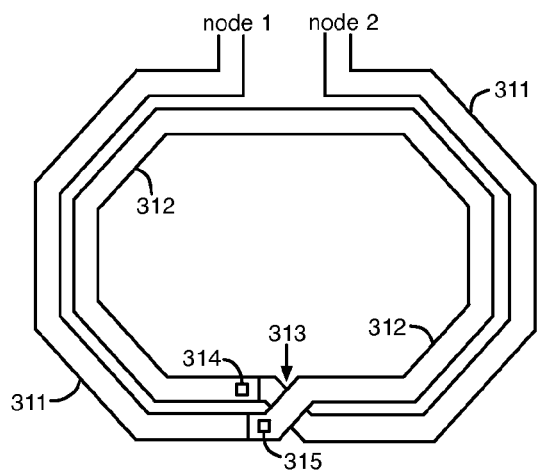
FIG. 3C is a process layout diagram that illustrates a top down view of an example of a metal option for an inductor, according to an embodiment of the present invention.

FIG. 3C is a process layout diagram that illustrates a top down view of an example of a metal option for inductor 209, according to an embodiment of the present invention. FIG. 3C shows a coil of inductor 209 having an outer turn and an inner turn. Conductor 311 is the outer turn of inductor 209, and conductor 312 is the inner turn of inductor 209. Conductors 311-312 are formed of metal, or alternatively, another type of conductive material. Conductor 311 is formed in a first metal layer, and conductor 312 is formed in a second metal layer. Conductors 311 and 312 cross each other at intersection 313. Conductor 311 is coupled to input nodes 1 and 2.

Conductor 312 is an example of metal option 216. Conductor 312 can be connected to conductor 311 through vias 314 and 315. Conductor 312 can be added to the mask for the second metal layer to connect an inner turn to the outer turn of inductor 209. Alternatively, a portion of or all of conductor 312 can be removed from the mask for the second metal layer to remove the inner turn from inductor 209 or simply to disconnect the inner turn from the outer turn. The inner turn 312 can be added to the second metal layer and connected to the outer turn 311 to increase the inductance of inductor 209. The inner turn 312 can be removed from the second metal layer or disconnected from the outer turn 311 to decrease the inductance of inductor 209.

Figure 3D:
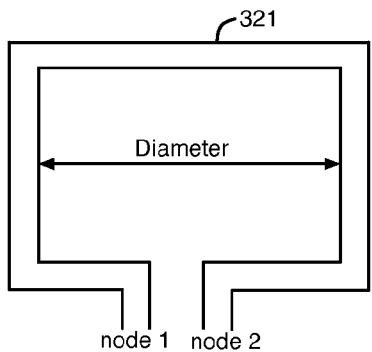
FIGS. 3D-3E are process layout diagrams that illustrate top down views of an example of a metal option for an inductor, according to another embodiment of the present invention.
Figure 3E:
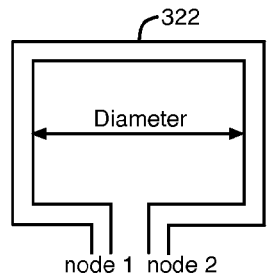

FIGS. 3D-3E are process layout diagrams that illustrate top down views of an example of a metal option for inductor 209, according to another embodiment of the present invention. Conductor 321 can be a turn of a coil of inductor 209. Conductor 322 can also be a turn of a coil of inductor 209. The routing conductors for VCO 200 are formed in the first metal layer. Conductors 321-322 are formed in the second metal layer. Some of the routing conductors for VCO 200 may be formed in third, fourth, etc. metal layers.

Conductors 321-322 are an example of metal option 216. Conductor 321 is formed in the second metal layer of the die to create a larger diameter turn of the coil of inductor 209. Conductor 322 is formed in the second metal layer of the die to create a smaller diameter turn of the coil of inductor 209. Changing the diameter of one or more turns of the coil affects the inductance of inductor 209. Either conductor 321 or conductor 322 is connected to conductors of inductor 209 (e.g., additional turns of the coil) in the first metal layer at nodes 1 and 2. The mask used to create the second metal layer is modified to affect the changes to the diameter of the turn of the coil that are shown in FIGS. 3D-3E.

Inductor 209 may have multiple turns in its coil. However, only one turn is shown in each of FIGS. 3D-3E to simplify the drawings. According to an embodiment, the diameters of multiple turns of the coil of inductor 209 can be modified by changing the diameters of corresponding conductors in the second conductive layer.

Referring again to FIG. 2, metal option 207 can connect varactor 203 to node 241 or disconnect varactor 203 from node 241. Metal option 208 can connect varactor 204 to node 242 or disconnect varactor 204 from node 242. Metal options 207-208 can connect varactors 203-204 to nodes 241-242, respectively, to increase the frequency tuning range of VCO 200. Metal options 207-208 can disconnect varactors 203-204 from nodes 241-242, respectively, to decrease the frequency tuning range of VCO 200. Metal options 207-208 can be implemented by adding or not adding a portion of a routing conductor to an additional conductive layer, as described above. When varactors 203 and 204 are disconnected from nodes 241-242, respectively, the routing conductors are removed from metal options 207-208 to reduce the parasitic capacitances introduced by varactors 203-204 at nodes 241-242.

Metal option 213 can connect capacitor 222 to node 241 or disconnect capacitor 222 from node 241. If metal option 213 is conductive, metal option 212 can connect capacitor 221 to node 241 or disconnect capacitor 221 from node 241. Metal option 214 can connect capacitor 225 to node 242 or disconnect capacitor 225 from node 242. If metal option 214 is conductive, metal option 215 can connect capacitor 226 to node 242 or disconnect capacitor 226 from node 242. Metal options 212-215 can be implemented by adding or not adding a portion of a routing conductor to an additional conductive layer, as described above.

The extra fixed capacitors 221-222 and 225-226 can be coupled to nodes 241-242 in a particular integrated circuit die by making metal options 212-215 conductive, if the die is intended to have the flexibility to adjust the fixed capacitances at nodes 241-242 after the die is formed by changing the conductive states of switches 231-232 and 235-236. For example, metal options 212-215 may be conductive in an oscillator that is intended to function at high or low frequencies.

In an oscillator intended to function only at high frequencies, metal options 212-215 can be open circuits in the second conductive layer to disconnect unused circuit elements (e.g., capacitors 221-222, capacitors 225-226, switches 231-232, and switches 235-236) from nodes 241-242, thus reducing the parasitic capacitances at nodes 241 and 242. Reducing the parasitic capacitances at nodes 241-242 causes VCO 200 to generate a maximum frequency, a minimum frequency, a center frequency, and a frequency tuning range for CLKOUT1 and CLKOUT2 that are as large as possible. For example, if capacitors 221-222 and 225-226 are not intended to be used in an integrated circuit die, routing conductors in metal options 213 and 214 can be removed from the die to create open circuits that reduce the parasitic capacitances at nodes 241 and 242.

As another example, if capacitors 222 and 225 may be used in an integrated circuit die, but capacitors 221 and 226 are not intended to be used in that die, routing conductors in metal options 213 and 214 are added to the die to connect capacitors 222 and 225 to nodes 241 and 242, respectively, and the routing conductors in metal options 212 and 215 are removed from the die to create open circuits that reduce the parasitic capacitances at nodes 241 and 242.

Metal option 216 can reduce the parasitic capacitances at nodes 241 and 242 by removing an unneeded turn of the coil in inductor 209. Metal option 216 can also be used to change the inductance value of inductor 209. Based on equation (1) shown above, a smaller inductance value for inductor 209 can allow the frequency of the output clock signals CLKOUT1 and CLKOUT2 of VCO 200 to increase. Most of the increase in the frequency of the output clock signals of VCO 200 is the result of changing the inductance value of inductor 209.

The frequencies of CLKOUT1 and CLKOUT2 increase in response to reductions in the parasitic capacitances at nodes 241 and 242. Specifically, the maximum frequency, the minimum frequency, the center frequency, and the frequency tuning range of CLKOUT1 and CLKOUT2 all increase in response to reductions in the parasitic capacitances at nodes 241-242. To use an example, VCO 200 can generate data rates for CLKOUT1 and CLKOUT2 that are up to 10-11 Gigabytes per second (Gbps). This example is not intended to limit the scope of the present invention.

As mentioned above, VCO 200 can generate multiple different frequency tuning ranges for CLKOUT1 and CLKOUT2. The parasitic capacitances in VCO 200 cause less of a reduction in the frequency tuning ranges of CLKOUT1 and CLKOUT2, when metal options 207-208 and 212-216 reduce the parasitic capacitances at nodes 241-242 that are caused by unused circuit elements. Therefore, VCO 200 can support a wide frequency tuning range at small and large center frequencies of CLKOUT1 and CLKOUT2.

To use a specific example that is not intended to limit the scope of the present invention, VCO 200 can support a maximum center frequency for CLKOUT1 and CLKOUT2 that is twice the minimum center frequency supported by VCO 200. By using metal options to reduce the fixed capacitance at nodes 241-242, the number of varactors, and the size and inductance of inductor 209, VCO 200 can generate larger frequencies for CLKOUT1 and CLKOUT2. At higher data rates, the metal options are used to remove the extra capacitive and inductive loading that is required at lower data rates (i.e., 5-6 Gbps).

The metal options described herein can be used to create multiple integrated circuit dies each having an oscillator circuit. The oscillator circuits in the integrated circuit dies differ in architecture from each other only with respect to the conductivity of metal option conductors 207-208 and 212-216 in one or more additional conductive layers, as described above and as shown in the figures. Only the additional conductive layers (e.g., the second metal layer) are modified to create the differences between the oscillator circuits in each die.

Figure 4:
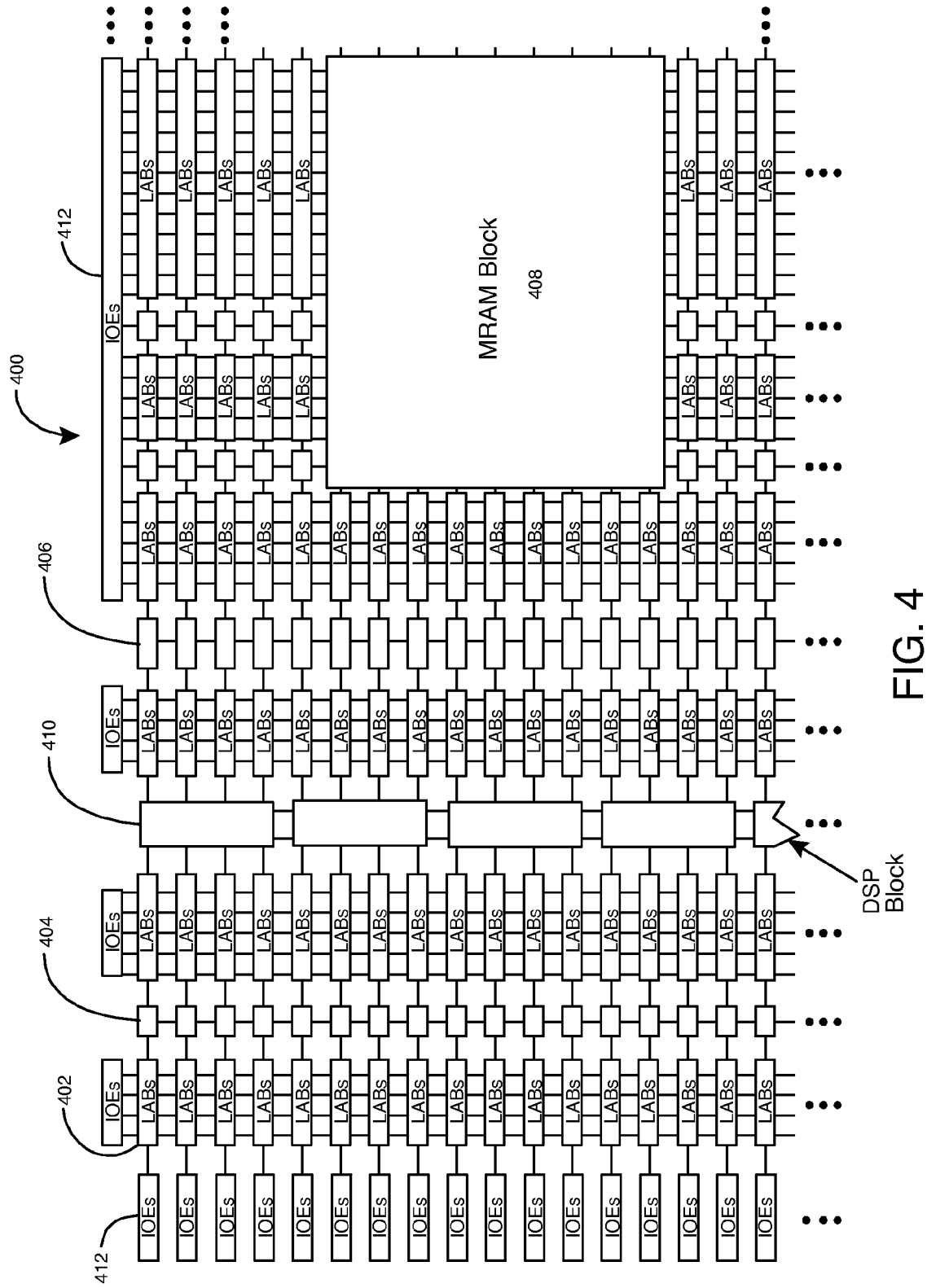
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 400 is described herein for illustrative purposes only and that the present invention can be implemented in many different types of PLDs, FPGAs, and ASICs.

Figure 5:
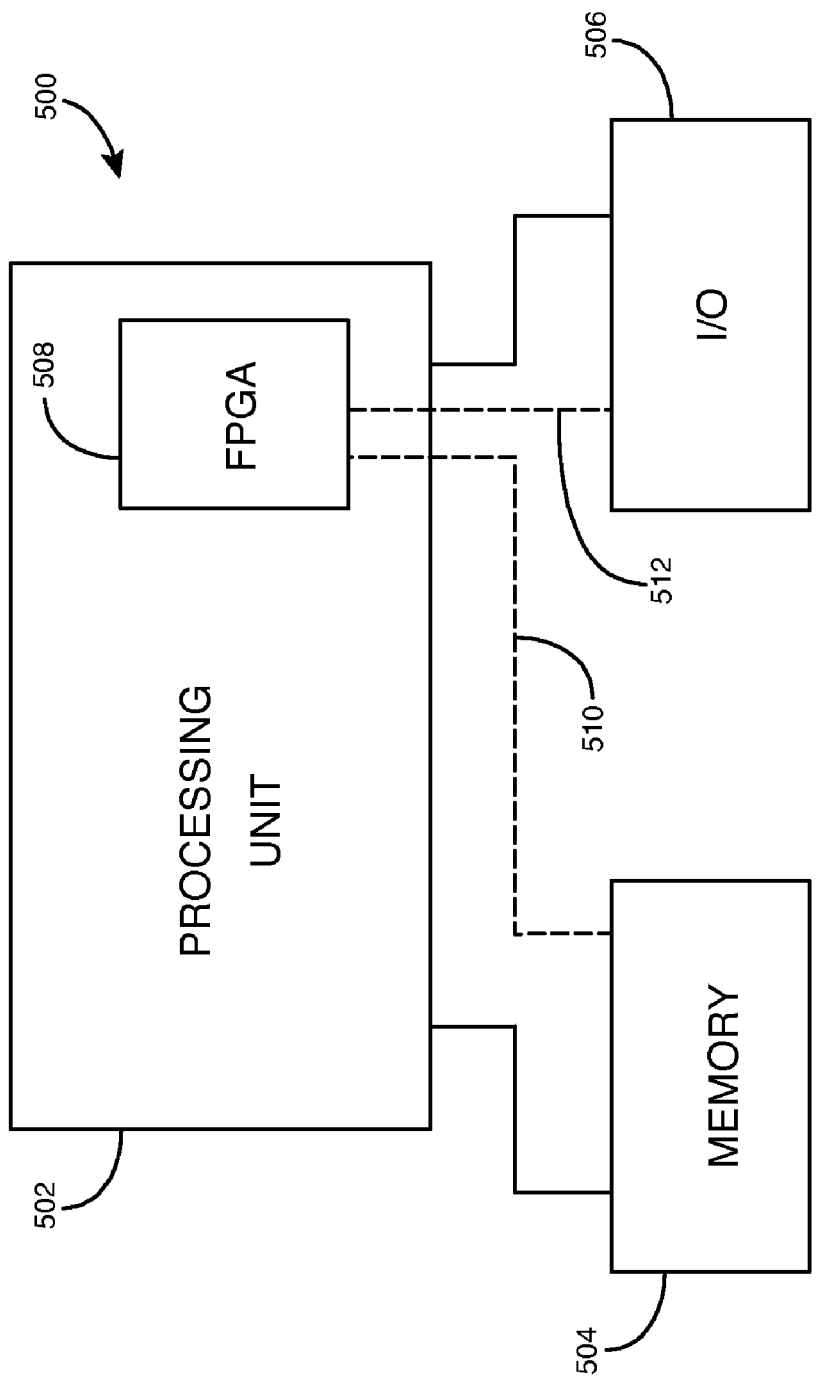
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor, which can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An oscillator circuit comprising:
    first transistors that are cross-coupled through routing conductors in a first conductive layer;
    a first varactor;
    a first capacitor; and
    a first option conductor in a second conductive layer that decouples one of the first capacitor and the first varactor from a node in the oscillator circuit to reduce a parasitic capacitance at the node in the oscillator circuit.

2. The oscillator circuit defined in claim 1 further comprising:
    an inductor coupled to one of the first transistors through routing conductors in the first conductive layer; and
    a second option conductor in the second conductive layer that forms a first turn of the inductor, wherein a second turn of the inductor is formed in the first conductive layer.

3. The oscillator circuit defined in claim 1 further comprising:
    a first switch coupled to the first capacitor through routing conductors in the first conductive layer;
    a second capacitor;
    a second switch coupled to the second capacitor through routing conductors in the first conductive layer; and
    a second option conductor in the second conductive layer that forms at least a portion of a connection between the second capacitor and the first capacitor.

4. The oscillator circuit defined in claim 3 further comprising:
    a third capacitor;

a third switch coupled to the third capacitor through routing conductors in the first conductive layer; and a third option conductor in the second conductive layer that forms at least a portion of a connection between the third capacitor and one of the first transistors.

5. The oscillator circuit defined in claim 4 further comprising:

a fourth capacitor;

a fourth switch coupled to the fourth capacitor through routing conductors in the first conductive layer; and a fourth option conductor in the second conductive layer that forms at least a portion of a connection between the fourth capacitor and the third capacitor.

6. The oscillator circuit defined in claim 1 further comprising:

a second varactor; and a second option conductor in the second conductive layer that forms at least a portion of a connection between the second varactor and one of the first transistors.

7. The oscillator circuit defined in claim 1 wherein the oscillator circuit is fabricated on a programmable logic integrated circuit.

8. The oscillator circuit defined in claim 1 further comprising:

second transistors that are cross-coupled together and coupled to the first varactor through routing conductors in the first conductive layer.

9. Integrated circuit dies, wherein each of the integrated circuit dies comprises:

an oscillator circuit comprising first transistors that are cross-coupled through a first subset of first routing conductors in a first conductive layer, a first varactor, a first capacitor, and an inductor coupled to at least one of the first transistors through one of the first routing conductors, wherein each of the integrated circuit dies in a first subset comprises a second routing conductor in a second conductive layer that forms at least a portion of a connection between at least one of the first transistors and at least one of the first capacitor and the first varactor, and wherein each of the integrated circuit dies in a second subset comprises a first open circuit in the second conductive layer that prevents current flow through at least one of the first capacitor and the first varactor, wherein the first open circuit in each of the integrated circuit dies in the second subset reduces a parasitic capacitance at a node in the oscillator circuit by decoupling one of the first capacitor and the first varactor from the node in the oscillator circuit.

10. The integrated circuit dies defined in claim 9 wherein each of the integrated circuit dies in the first subset comprises a third routing conductor in the second conductive layer that forms a first turn of the inductor, and wherein a second turn of the inductor is formed in the first conductive layer in each of the integrated circuit dies in the first subset.

11. The integrated circuit dies defined in claim 9 wherein the second routing conductor forms a portion of a connection between at least one of the first transistors and the first capacitor, a third routing conductor in the second conductive layer in each of the integrated circuit dies in the first subset forms a portion of a connection between the first varactor and at least one of the first transistors, the first open circuit prevents current flow through the first capacitor, and each of the integrated circuit dies in the second subset comprises a second open circuit in the second conductive layer that prevents current flow through the first varactor.

12. The integrated circuit dies defined in claim 9 wherein the oscillator circuit further comprises a second capacitor, the second routing conductor forms a portion of a connection between at least one of the first transistors and the first capacitor, a third routing conductor in the second conductive layer in each of the integrated circuit dies in the first subset forms a portion of a connection between the second capacitor and at least one of the first transistors, and each of the integrated circuit dies in the second subset comprises a second open circuit in the second conductive layer that prevents current flow through the second capacitor.

13. The integrated circuit dies defined in claim 12 wherein the oscillator circuit further comprises a third capacitor, a fourth routing conductor in the second conductive layer in each of the integrated circuit dies in the first subset forms a portion of a connection between the third capacitor and at least one of the first transistors, and each of the integrated circuit dies in the second subset comprises a third open circuit in the second conductive layer that prevents current flow through the third capacitor.

14. The integrated circuit dies defined in claim 9 wherein the oscillator circuit further comprises second transistors that are cross-coupled and coupled to the first transistors through a second subset of the first routing conductors.

15. The integrated circuit dies defined in claim 9 wherein the oscillator circuit further comprises a second varactor, the second routing conductor forms a portion of a connection between at least one of the first transistors and the first varactor, a third routing conductor in the second conductive layer in each of the integrated circuit dies in the first subset forms a portion of a connection between the second varactor and at least one of the first transistors, and each of the integrated circuit dies in the second subset comprises a second open circuit in the second conductive layer that prevents current flow through the second varactor.

16. The integrated circuit dies defined in claim 9 wherein the oscillator circuit further comprises second and third varactors that are coupled to the first transistors through a second subset of the first routing conductors, the second routing conductor forms a portion of a connection between at least one of the first transistors and the first varactor, and the first open circuit prevents current flow through the first varactor in each of the integrated circuit dies in the second subset.

17. An oscillator circuit comprising:

first transistors that are cross-coupled through routing conductors formed in a first conductive layer;

a first capacitor coupled to one of the first transistors;

an inductor coupled to one of the first transistors through one of the routing conductors; and a first option conductor that forms a first turn of the inductor, wherein a second turn of the inductor is formed in the first conductive layer, and wherein the first option conductor is in a second conductive layer different from the first conductive layer.

18. The oscillator circuit defined in claim 17 further comprising:

a first varactor; and a second option conductor in the second conductive layer that forms at least a portion of a connection between one of the first transistors and the first varactor, wherein the second option conductor is coupled to one of the routing conductors.

19. The oscillator circuit defined in claim 18 further comprising:

a second varactor; and a third option conductor in the second conductive layer that forms at least a portion of a connection between one of the first transistors and the second varactor, wherein the third option conductor is coupled to one of the routing conductors.

20. The oscillator circuit defined in claim 17 further comprising:
a second capacitor; and
a second option conductor in the second conductive layer that forms at least a portion of a connection between one of the first transistors and the second capacitor, wherein the second option conductor is coupled to one of the routing conductors.

21. A method for forming an oscillator, the method comprising:
increasing a capacitance at a node of the oscillator in a first set of integrated circuit dies by adding an option conductor to a modified conductive layer;
decreasing the capacitance at the node of the oscillator in a second set of integrated circuit dies by removing at least a portion of the option conductor from the modified conductive layer; and
coupling together components in the oscillator using one or more conductive layers other than the modified conductive layer.

22. The method defined in claim 21 wherein increasing the capacitance at the node of the oscillator in the first set of integrated circuit dies further comprises increasing the capacitance at the node by coupling a variable capacitance to the node, and wherein decreasing the capacitance at the node of the oscillator in the second set of integrated circuit dies further comprises decreasing the capacitance at the node by decoupling the variable capacitance from the node.

23. The method defined in claim 21 wherein increasing the capacitance at the node of the oscillator in the first set of integrated circuit dies further comprises increasing the capacitance at the node by coupling a fixed capacitance to the node, and wherein decreasing the capacitance at the node of the oscillator in the second set of integrated circuit dies further comprises decreasing the capacitance at the node by decoupling the fixed capacitance from the node.

* * * * *